United States Patent
Nakayama et al.

(10) Patent No.: US 11,968,849 B2
(45) Date of Patent: Apr. 23, 2024

(54) RADIATION DETECTOR

(71) Applicant: KABUSHIKI KAISHA TOSHIBA, Tokyo (JP)

(72) Inventors: Kohei Nakayama, Kawasaki (JP); Isao Takasu, Setagaya (JP); Atsushi Wada, Kawasaki (JP); Fumihiko Aiga, Kawasaki (JP); Yuko Nomura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 436 days.

(21) Appl. No.: 17/460,451

(22) Filed: Aug. 30, 2021

(65) Prior Publication Data

US 2022/0285441 A1 Sep. 8, 2022

(30) Foreign Application Priority Data

Mar. 5, 2021 (JP) .................................. 2021-035006

(51) Int. Cl.
*H10K 39/36* (2023.01)
*G01T 1/20* (2006.01)
*G01T 1/24* (2006.01)

(52) U.S. Cl.
CPC ............. *H10K 39/36* (2023.02); *G01T 1/241* (2013.01); *G01T 1/2002* (2013.01)

(58) Field of Classification Search
CPC ........ H10K 39/36; H10K 30/81; H10K 30/20; H10K 39/30; G01T 1/241; G01T 1/2002
See application file for complete search history.

(56) References Cited

U.S. PATENT DOCUMENTS

| | | | | |
|---|---|---|---|---|
| 2009/0072159 A1* | 3/2009 | Yokoi | ..................... | G01T 1/243 |
| | | | | 250/370.09 |
| 2009/0078877 A1* | 3/2009 | Yaegashi | ............... | G01T 1/2006 |
| | | | | 250/370.08 |
| 2018/0143329 A1* | 5/2018 | Takasu | ..................... | G01T 1/20 |

FOREIGN PATENT DOCUMENTS

| | | |
|---|---|---|
| JP | 2009-094465 A | 4/2009 |
| JP | 2018-85387 A | 5/2018 |

* cited by examiner

*Primary Examiner* — David P Porta
*Assistant Examiner* — Gisselle M Gutierrez
(74) *Attorney, Agent, or Firm* — Oblon, McClelland, Maier & Neustadt, L.L.P.

(57) ABSTRACT

According to one embodiment, a radiation detector includes a detecting part, and a transmitting part. The detecting part is configured to output a signal. The signal corresponds to radiation incident on the detecting part. The transmitting part includes a first conductive layer, a second conductive layer, and an organic layer. The first conductive layer is electrically connected with the detecting part, and is configured to transmit the signal. The second conductive layer is separated from the first conductive layer. At least a portion of the organic layer is between the first conductive layer and the second conductive layer.

19 Claims, 7 Drawing Sheets

RADIATION DETECTOR

CROSS-REFERENCE TO RELATED APPLICATIONS

This application is based upon and claims the benefit of priority from Japanese Patent Application No. 2021-035006, filed on Mar. 5, 2021; the entire contents of which are incorporated herein by reference.

FIELD

Embodiments described herein relate generally to a radiation detector.

BACKGROUND

It is desirable to increase the sensitivity of a radiation detector.

DETAILED DESCRIPTION

Figure 1A:
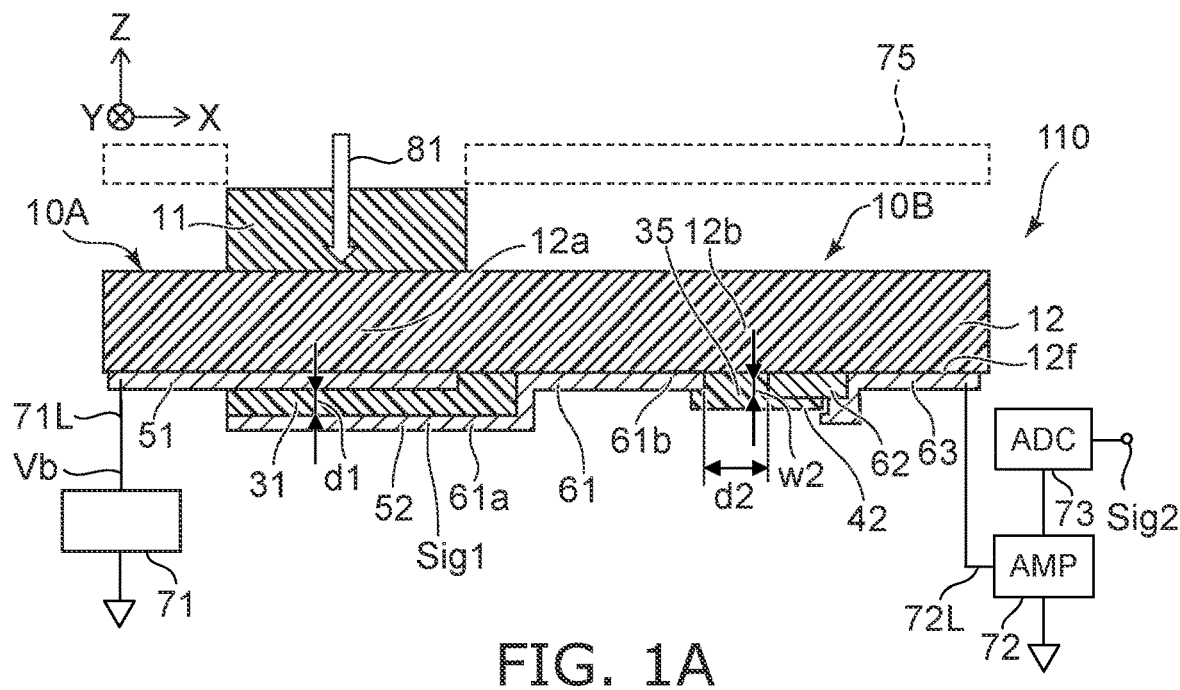
FIGS. 1A and 1B are schematic views illustrating a radiation detector according to a first embodiment.

According to one embodiment, a radiation detector includes a detecting part, and a transmitting part. The detecting part is configured to output a signal. The signal corresponds to radiation incident on the detecting part. The transmitting part includes a first conductive layer, a second conductive layer, and an organic layer. The first conductive layer is electrically connected with the detecting part, and is configured to transmit the signal. The second conductive layer is separated from the first conductive layer. At least a portion of the organic layer is between the first conductive layer and the second conductive layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions In the specification and drawings, components similar to those described previously or illustrated in an antecedent drawing are marked with like reference numerals, and a detailed description is omitted as appropriate.

First Embodiment

Figure 1B:
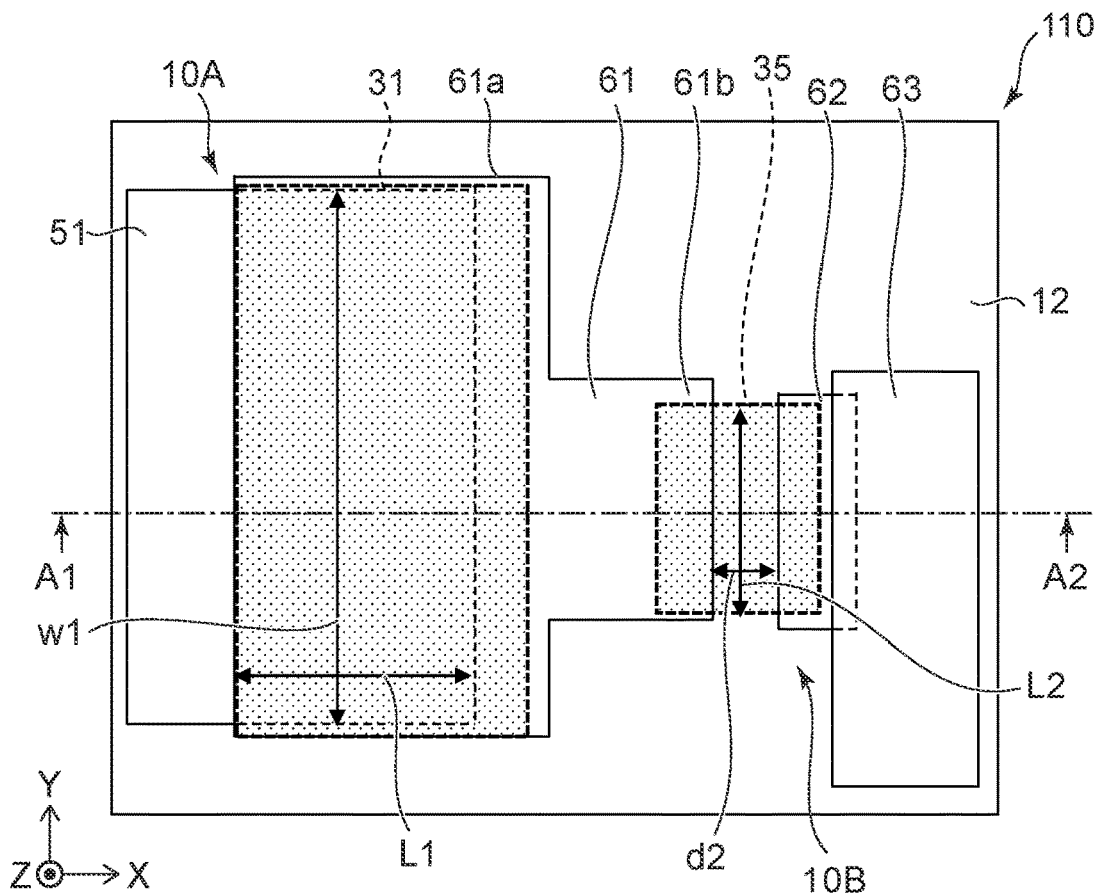

FIGS. 1A and 1B are schematic views illustrating a radiation detector according to a first embodiment.

FIG. 1A is a line A1-A2 cross-sectional view of FIG. 1B. FIG. 1B is a plan view in which a portion included in the radiation detector is extracted.

As shown in FIG. 1A, the radiation detector 110 according to the embodiment includes a detecting part 10A and a transmitting part 10B. The detecting part 10A is configured to output a signal Sig1 corresponding to radiation 81 that is incident on the detecting part 10A. The signal Sig1 is extracted to the outside via the transmitting part 10B.

The transmitting part 10B includes a first conductive layer 61, a second conductive layer 62, and an organic layer 35. The first conductive layer 61 is electrically connected with the detecting part 10A. The first conductive layer 61 is configured to transmit the signal Sig1. The second conductive layer 62 is separated from the first conductive layer 61. At least a portion of the organic layer 35 is between the first conductive layer 61 and the second conductive layer 62. For example, the transmitting part 10B functions as a capacitance.

A third conductive layer 63 that is electrically connected with the second conductive layer 62 is included in the example. For example, the third conductive layer 63 functions as a terminal part. The third conductive layer 63 is provided as necessary and may be omitted.

In the example, the first conductive layer 61 includes a first conductive portion 61a and a second conductive portion 61b. These conductive portions may be continuous with each other. The first conductive portion 61a is one region of the first conductive layer 61. The second conductive portion 61b is another region of the first conductive layer 61.

In the example, the detecting part 10A includes a first electrode 51 and a semiconductor layer 31. For example, the semiconductor layer 31 may be an organic semiconductor layer. The semiconductor layer 31 is between the first conductive portion 61a and the first electrode 51 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction. The Z-axis direction corresponds to the stacking direction of the first conductive portion 61a, the semiconductor layer 31, and the first electrode 51.

At least a portion of the organic layer 35 is between the second conductive portion 61b (the first conductive layer 61) and the second conductive layer 62 in a second direction. The second direction crosses the first direction (the Z-axis direction). The second direction is, for example, any direction along the X-Y plane. In the example, a portion of the organic layer 35 is between the second conductive portion 61b (the first conductive layer 61) and the second conductive layer 62 in the X-axis direction.

A base body 12 is included in the example. The base body 12 may be, for example, a substrate. The base body 12 may include, for example, an organic material. The base body 12 may be, for example, a resin substrate, a resin film, etc. The base body 12 may be, for example, a glass substrate, etc.

The base body 12 includes a first base body region 12a and a second base body region 12b. The second base body region 12b may be continuous with the first base body region 12a. The first base body region 12a is one region of the base body 12. The second base body region 12b is another region of the base body 12. At least a portion of the first electrode 51 is between the semiconductor layer 31 and the first base body region 12a in the first direction (the Z-axis direction).

The direction from the at least a portion of the organic layer 35 toward the second base body region 12b is along the first direction (the Z-axis direction).

According to the embodiment, the transmitting part 10B does not overlap the detecting part 10A in the Z-axis direction. For example, the radiation that is incident on the detecting part 10A can be prevented from being incident on the transmitting part 10B. For example, the transmitting part 10B can be easily shielded by a housing 75 (referring to FIG. 1A), etc.

For example, in the detecting part 10A, a charge +Q is induced in the first conductive portion 61a according to the radiation 81. A charge −Q is induced in the second conductive portion 61b according to the charge +Q. Thereby, in the second conductive layer 62, the charge +Q is induced, and a voltage is generated. The radiation 81 can be detected by detecting the voltage generated in the second conductive layer 62. For example, the characteristics of the transmitting part 10B are more stable when the radiation 81 is not incident on the transmitting part 10B. Compared to when the transmitting part 10B is not included, a stable and highly-sensitive detection is possible according to the embodiment.

For example, the first electrode 51 and the organic layer 35 may be located at a first surface 12f of the base body 12.

As shown in FIG. 1A, the detecting part 10A may further include a scintillator layer 11. The scintillator layer 11 is not illustrated in FIG. 1B. When the base body 12 is included, the first electrode 51 is between the semiconductor layer 31 and the scintillator layer 11. The first base body region 12a is between the first electrode 51 and the scintillator layer 11. When the first base body region 12a of the base body 12 is omitted, the first electrode 51 may contact the scintillator layer 11.

For example, the radiation 81 of the detection object is incident on the scintillator layer 11. The radiation 81 is converted into light in the scintillator layer 11. The light that is generated is incident on the semiconductor layer 31. A movable charge is generated in the semiconductor layer 31 based on the incident light. A bias voltage Vb is applied to the first electrode 51 by a power supply 71. Thereby, the charge that is generated is moved toward the first electrode 51 or the first conductive portion 61a. The signal Sig1 is generated by the charge that has moved. In one example, the bias voltage Vb is negative.

The signal Sig1 is input to an amplifier 72 via the transmitting part 10B and the third conductive layer 63. For example, a signal that is amplified by the amplifier 72 may be converted into a digital signal by an AD converter 73. The signal that is obtained from the AD converter 73 is utilized as a detection result signal Sig2. For example, these electrical connections may be performed by wiring 71L and 72L, etc.

According to the embodiment, the radiation 81 may be converted into an electrical signal in the semiconductor layer 31 without including the scintillator layer 11.

In the detecting part 10A, a first capacitance is formed of the first electrode 51, the first conductive portion 61a, and the semiconductor layer 31. On the other hand, in the transmitting part 10B, a second capacitance is formed of the first conductive layer 61, the second conductive layer 62, and the organic layer 35.

For example, the surface area of the region where the first electrode 51 and the first conductive portion 61a face each other corresponds to the surface area of the detecting part 10A. By increasing the surface area of the detecting part 10A, the surface area of the incidence of the radiation 81 or the light based on the radiation 81 is increased. A high detection efficiency is obtained thereby. For example, high sensitivity is obtained. The electrical capacitance of the first capacitance is increased by increasing the surface area of the detecting part 10A. The electrical capacitance of the first capacitance corresponds to the electrical capacitance between the first electrode 51 and the first conductive portion 61a.

For example, the charge +Q is induced in the first conductive portion 61a in the detecting part 10A by the charge that corresponds to the light corresponding to the radiation 81. A voltage V1 is generated in the first conductive portion 61a by the charge +Q induced in the first conductive portion 61a. The value of the voltage V1 decreases when the electrical capacitance of the detecting part 10A increases. The detection sensitivity is low in a reference example in which the voltage V1 is detected without including the transmitting part 1013.

According to the embodiment, the transmitting part 10B is included in addition to the detecting part 10A. In the transmitting part 10B, the charge −Q is induced in the second conductive portion 61b according to the charge +Q induced in the first conductive portion 61a. Thereby, the charge +Q is induced in the second conductive layer 62. The value of a voltage V2 generated in the second conductive layer 62 is increased by reducing the second capacitance of the transmitting part 10B. The voltage that is obtained according to the embodiment is greater than when the transmitting part 10B is not included. The detection sensitivity can be increased thereby. According to the embodiment, a radiation detector can be provided in which the sensitivity can be increased.

In a reference example that does not include the transmitting part 10B, the first capacitance is connected to the amplifier 72. In the reference example, it was found that noise in the detection signal is easily increased when the surface area of the detecting part 10A is increased. It is considered that the noise of the amplifier 72 is increased because the surface area of the detecting part 10A is increased and the electrical capacitance of the first capacitance is increased. It is considered that this is because the noise of the amplifier 72 is increased when the electrical capacitance of the capacitance connected to the amplifier 72 is increased.

According to the embodiment, the transmitting part 10B described above is included. Thereby, the amplifier 72 can be connected to the second capacitance of the transmitting part 10B. Thereby, the electrical capacitance of the capacitance to which the amplifier 72 is connected can be small even when the surface area of the detecting part 10A is increased. According to the embodiment, the noise can be suppressed even when the surface area of the detecting part 10A is increased.

According to the embodiment, the surface area of the detecting part 10A can be increased while suppressing the noise. According to the embodiment, the generation of the noise can be suppressed even when combined with the amplifier 72 in which noise is easily generated. A practical radiation detector can be provided in which the noise is suppressed and high sensitivity is obtained.

For example, various frequency components of 0.1 kHz to 1 GHz are included in the signal supplied to the amplifier 72. The frequency range for the detection of the radiation 81 is about 1 kHz to 10 kHz. In a reference example, the noise intensity of the amplifier 72 increases in a wide frequency range of 0.1 kHz to 1 GHz when the capacitance that is connected to the amplifier 72 is increased. The noise intensity of the amplifier 72 is increased also in the frequency range of 1 kHz to 10 kHz for the detection of the radiation 81.

The noise intensity of the amplifier 72 can be reduced by reducing the electrical capacitance of the capacitance connected to the amplifier 72. In particular, the noise intensity of the amplifier 72 can be maintained to be extremely small in the frequency range of 1 kHz to 10 kHz for the detection of the radiation 81.

Figure 2:
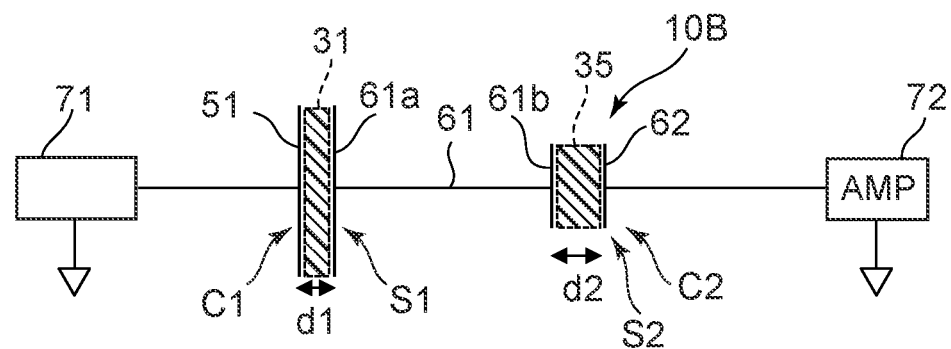
FIG. 2 is a circuit diagram corresponding to the radiation detector according to the first embodiment.

FIG. 2 is a circuit diagram corresponding to the radiation detector according to the first embodiment.

As shown in FIG. 2, the detecting part 10A can be considered to be a first capacitance C1. The transmitting part 10B can be considered to be a second capacitance C2. It is favorable for the electrical capacitance of the second capacitance C2 to be less than the electrical capacitance of the first capacitance C1. The first capacitance C1 includes a first surface area S1 and a first distance d1. The electrical capacitance of the first capacitance C1 is proportional to S1/d1. The second capacitance C2 includes a second surface area S2 and a second distance d2. The electrical capacitance of the second capacitance C2 is proportional to S2/d2.

For example, S2/d2 is less than S1/d1. For example, S2 is less than S1. For example, d2 is greater than d1.

As shown in FIG. 2, the detecting part 10A includes the first surface area S1 and the first distance d1. The first surface area S1 is the surface area of the region where the first conductive portion 61a and the first electrode face each other in the first direction. The first distance d1 is the distance in the first direction (the Z-axis direction) between the first conductive portion 61a and the first electrode 51 (referring to FIG. 1A). As shown in FIG. 1B, the first surface area S1 corresponds to the product of a first length L1 and a first width w1 of the region where the first conductive portion 61a and the first electrode face each other in the first direction.

As shown in FIG. 2, the transmitting part 10B includes the second surface area S2 and the second distance d2. The second surface area S2 is the surface area of the region where the second conductive portion 61b and the second conductive layer 62 face each other in the second direction (e.g., the Z-axis direction). The second distance d2 is the distance in the second direction (e.g., the X-axis direction) between the second conductive portion 61b and the second conductive layer 62 (referring to FIG. 1A). As shown in FIGS. 1A and 2B, the second surface area S2 is the product of a second length L2 and a second width w2 of the region where the second conductive portion 61b and the second conductive layer 62 face each other in the second direction (e.g., the Z-axis direction).

For example, the transmitting part 10B may include at least one of the second surface area S2 or the second distance d2. The second surface area S2 is less than the first surface area S1. The second distance d2 is greater than the first distance d1.

According to the embodiment, the material of the second conductive layer 62 may be different from the material of the first conductive layer 61. For example, the material of the second conductive layer 62 may be different from the material of the second conductive portion 61b. Thereby, for example, in the transmitting part 10B, the resistance changes according to the orientation of the current (or the orientation in which the electrons flow).

Figure 3:
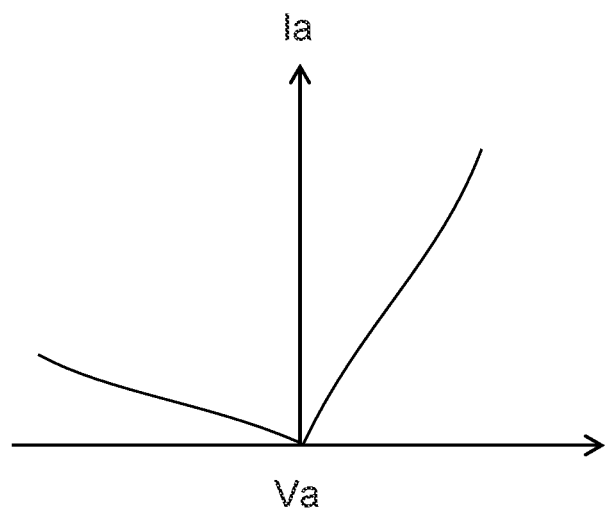
FIG. 3 is a schematic view illustrating the characteristics of a portion of the radiation detector according to the first embodiment.

FIG. 3 is a schematic view illustrating the characteristics of a portion of the radiation detector according to the first embodiment.

The horizontal axis of FIG. 3 is a voltage Va that is applied between the first conductive layer 61 and the second conductive layer 62 in the transmitting part 10B. The vertical axis is an absolute value Ia of the current flowing between the first conductive layer 61 and the second conductive layer 62. A large absolute value Ia of the current for the same absolute value of the voltage Va corresponds to the state in which the electrical resistance of the transmitting part 10B is low.

For example, a first electrical resistance between the first conductive layer 61 and the second conductive layer 62 when the current flows from the second conductive layer 62 toward the first conductive layer 61 is different from a second electrical resistance between the first conductive layer 61 and the second conductive layer 62 when the current flows from the first conductive layer 61 toward the second conductive layer 62. For example, the first electrical resistance is less than the second electrical resistance.

The charge that is stored in the transmitting part 10B can be quickly discharged by such an electrical resistance difference.

For example, a high response speed is easily obtained.

For example, such an electrical resistance difference is obtained by the material of the first conductive layer 61 and the material of the second conductive layer 62 being different from each other. For example, different work functions are obtained due to the material difference. An electrical resistance difference due to the current polarity is obtained thereby.

For example, the first conductive layer 61 includes at least one selected from the group consisting of Al, Mg, B, and C. In one example, the first conductive layer 61 includes an Al layer. For example, the second conductive layer 62 includes In, Sn, and oxygen. In one example, the second conductive layer 62 includes, for example, an ITO (Indium Tin Oxide) layer. The electrical resistance difference due to the current polarity is obtained by the material difference.

The second conductive layer 62 may include the same material as the material included in the first electrode 51. The first electrode 51 and the second conductive layer 62 may be formed of the same material. High productivity is obtained thereby. For example, the magnitude relationship of the work functions of the materials between the first electrode 51 and the first conductive portion 61a of the detecting part 10A is opposite to the magnitude relationship of the work functions of the materials between the second conductive layer 62 and the second conductive portion 61b of the transmitting part 10B.

Figure 4:
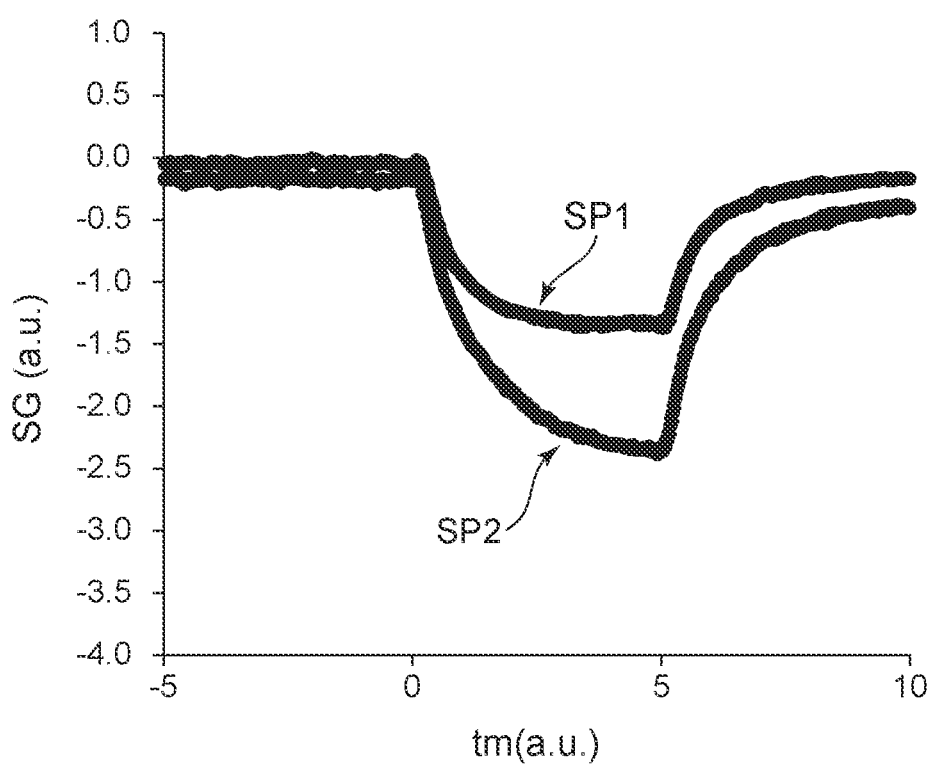
FIG. 4 is a schematic view illustrating characteristics of the radiation detector according to the first embodiment.

FIG. 4 is a schematic view illustrating characteristics of the radiation detector according to the first embodiment.

The horizontal axis of FIG. 4 is a time tm. The vertical axis is a detection signal SG. FIG. 4 illustrates characteristics of a first sample SP1 and a second sample SP2. In the first sample SP1, the material of the first conductive layer 61 is the same as the material of the second conductive layer 62. In the second sample SP2, the material of the first conductive layer 61 is different from the material of the second conductive layer 62. For example, the first electrical resistance is less than the second electrical resistance in the second sample SP2.

As shown in FIG. 4, the detection signal SG of the second sample SP2 has a higher response speed than the first sample SP1. The detection signal SG of the second sample SP2 has a larger amplitude than the first sample SP1.

Figure 5A:
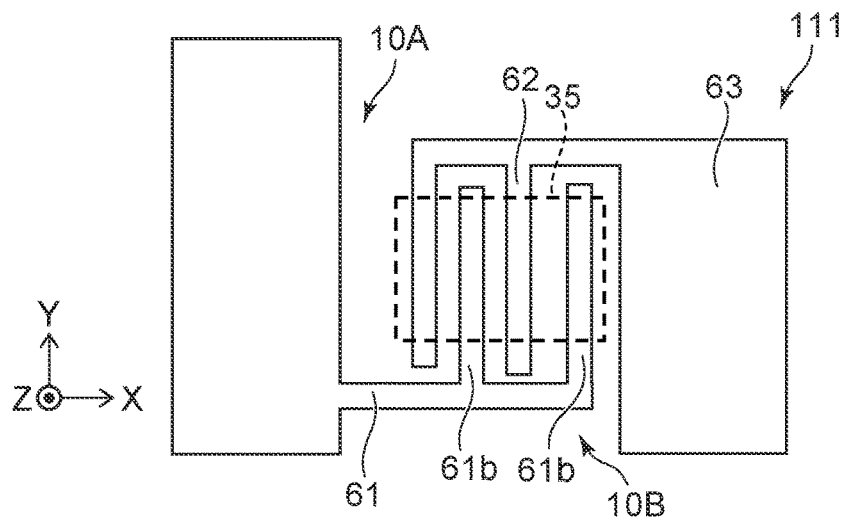
FIGS. 5A to 5C are schematic plan views illustrating portions of the radiation detector according to the first embodiment.
Figure 5B:
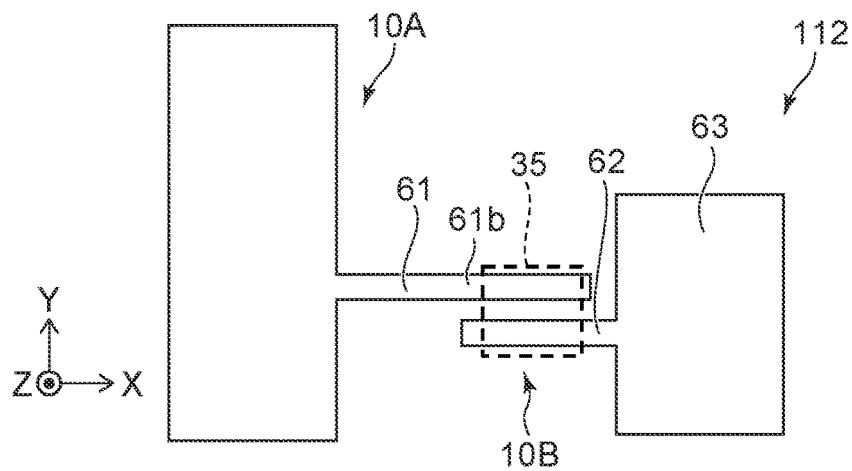
Figure 5C:
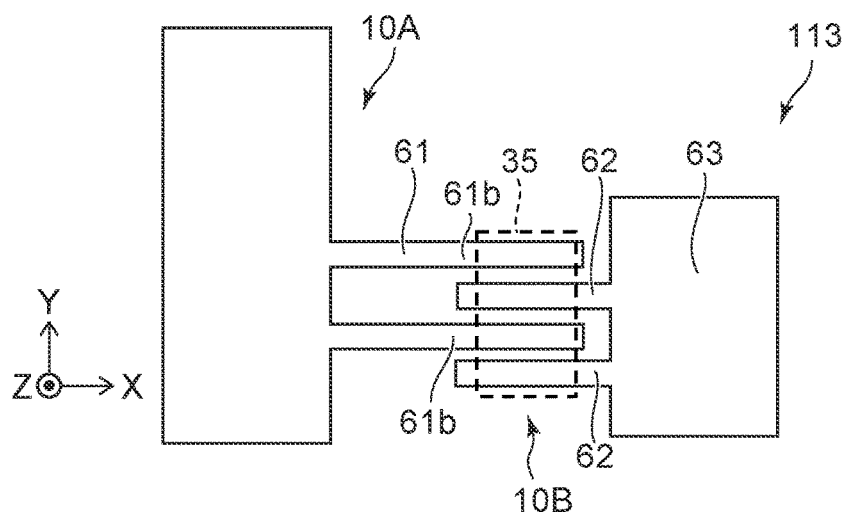

FIGS. 5A to 5C are schematic plan views illustrating portions of the radiation detector according to the first embodiment.

These drawings illustrate planar patterns of the first and second conductive layers 61 and 62.

As shown in FIG. 5A, a radiation detector 111 according to the embodiment includes multiple first conductive layers 61 (multiple second conductive portions 61*b*) and multiple second conductive layers 62. In the example, the multiple second conductive portions 61*b* and the multiple second conductive layers 62 are alternately arranged along the X-axis direction.

In a radiation detector 112 according to the embodiment as shown in FIG. 5B, the second conductive layer 62 and the second conductive portion 61*b* of the first conductive layer 61 face each other in the Y-axis direction. In such a case, the second direction corresponds to the Y-axis direction.

As shown in FIG. 5C, the radiation detector 113 according to the embodiment includes the multiple first conductive layers 61 (the multiple second conductive portions 61*b*) and the multiple second conductive layers 62. In the example, the multiple second conductive portions 61*b* and the multiple second conductive layers 62 are alternately arranged along the Y-axis direction.

When the multiple second conductive portions 61*b* and the multiple second conductive layers 62 are included, the electrical capacitance of the second capacitance is based on the electrical capacitance of the region where the multiple second conductive portions 61*b* and the multiple second conductive layers 62 face each other.

Figure 6:
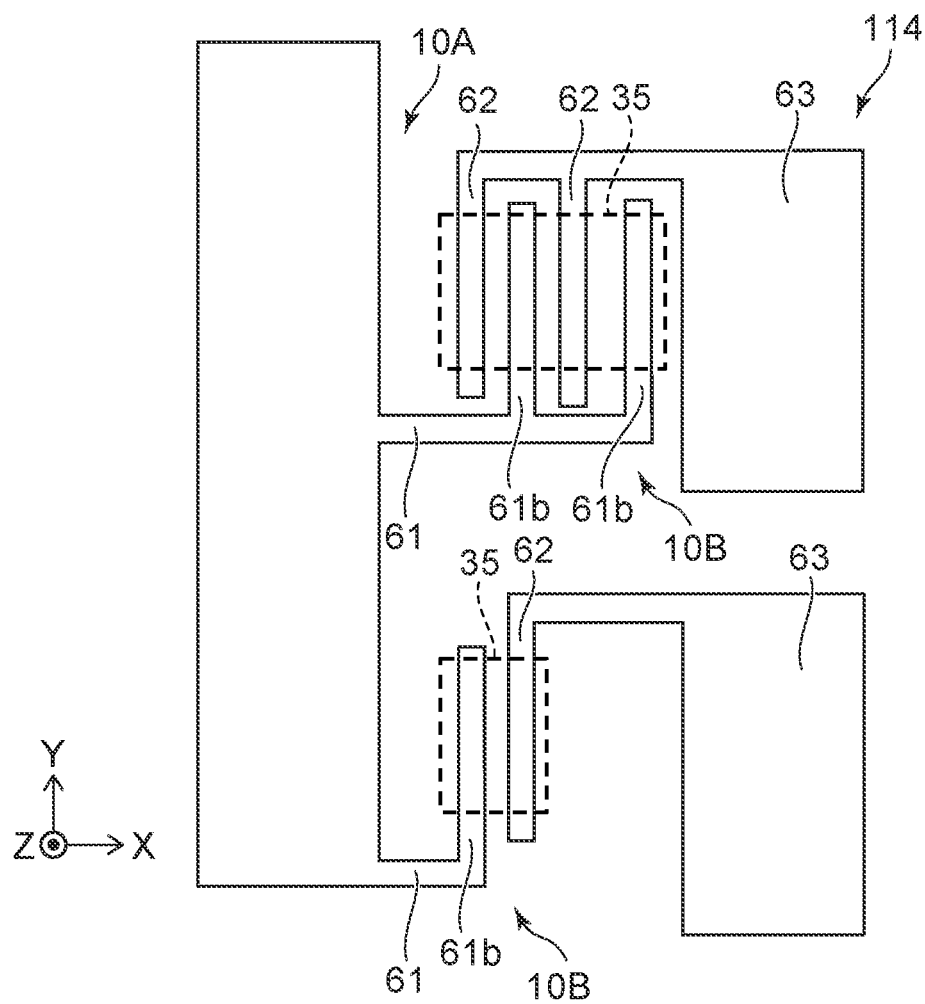
FIG. 6 is a schematic plan view illustrating a portion of a radiation detector according to the first embodiment.

FIG. 6 is a schematic plan view illustrating a portion of a radiation detector according to the first embodiment.

These drawings illustrate a planar pattern of the first and second conductive layers 61 and 62.

As shown in FIG. 6, the radiation detector 114 according to the embodiment includes multiple transmitting parts 10B. For example, the number of structures that include the second conductive portion 61*b* and the second conductive layer 62 is different between the multiple transmitting parts 10B. For example, different electrical capacitances are obtained. The time constant of the detection signal can be adjusted by selecting the multiple transmitting parts 10B.

Figure 7A:
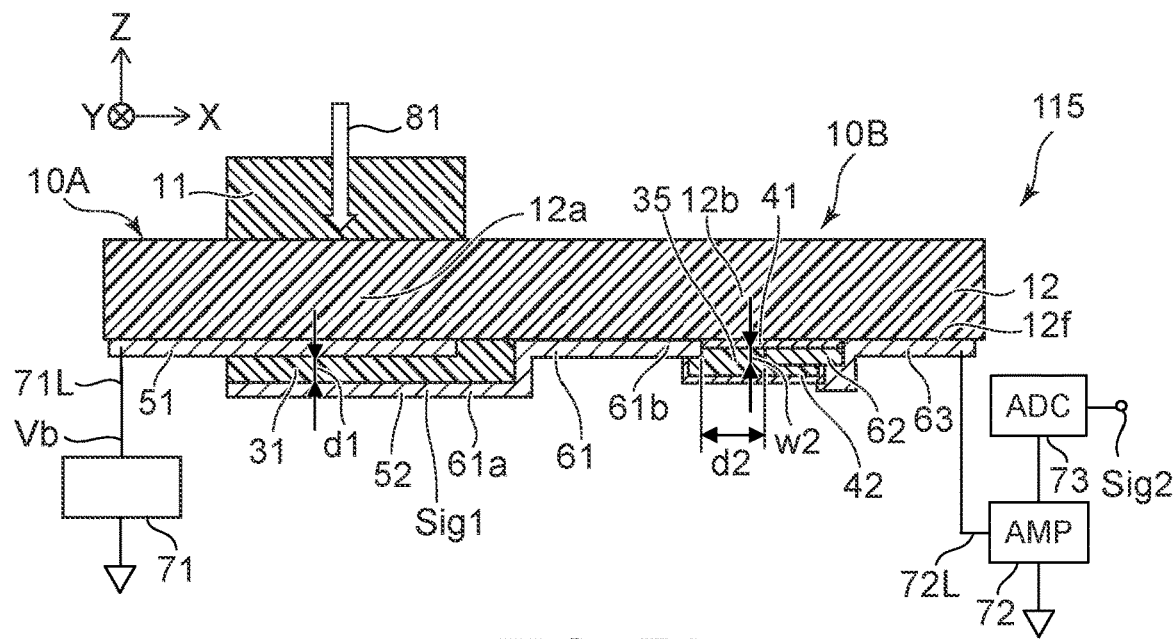
FIGS. 7A and 7B are schematic views illustrating a radiation detector according to the first embodiment.
Figure 7B:
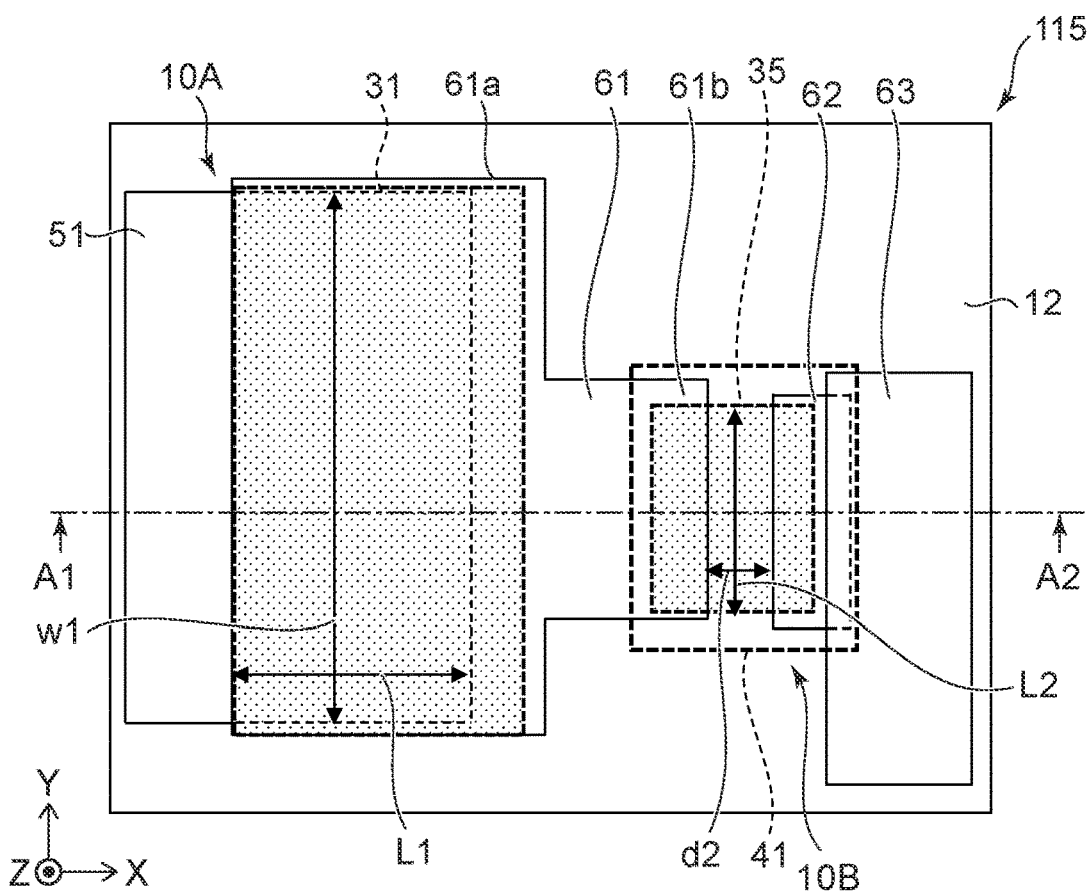

FIGS. 7A and 7B are schematic views illustrating a radiation detector according to the first embodiment.

FIG. 7A is a line A1-A2 cross-sectional view of FIG. 7B. FIG. 7B is a plan view in which a portion included in the radiation detector is extracted.

As shown in FIG. 7A, the radiation detector 115 according to the embodiment also includes the detecting part 10A and the transmitting part 10B. In the radiation detector 115, the transmitting part 10B further includes a first light-absorbing layer 41 in addition to the first conductive layer 61, the second conductive layer 62, and the organic layer 35. The transmitting part 10B may further include a second light-absorbing layer 42. Otherwise, the configuration of the radiation detector 115 may be similar to the radiation detectors 110 to 113.

The first light-absorbing layer 41 is between the organic layer 35 and the base body 12. The absorptance of the first light-absorbing layer 41 for light is greater than the absorptance of the organic layer 35 for the light. The wavelength of the light is, for example, a wavelength of visible light. The wavelength of the visible light may be, for example, not less than 480 nm and not more than 680 nm.

By providing such a first light-absorbing layer 41, the incidence of the light on the organic layer 35 can be suppressed. For example, there is a possibility that the light that is generated in the scintillator layer 11 may pass through the base body 12 and propagate into the transmitting part 10B. By providing the first light-absorbing layer 41, the incidence of the light on the organic layer 35 can be suppressed. Leakage to the transmitting part 10B can be suppressed. For example, the noise can be further suppressed. An appropriate signal is easily obtained.

The organic layer 35 may be located between the second light-absorbing layer 42 and the first light-absorbing layer 41.

The incidence of the light on the organic layer 35 from the direction opposite to the base body 12 can be suppressed thereby. The leakage to the transmitting part 10B can be suppressed. An appropriate signal is easily obtained. The absorptance of the second light-absorbing layer 42 for the light is greater than the absorptance of the organic layer 35 for the light.

The first light-absorbing layer 41 and the second light-absorbing layer 42 are, for example, insulative. The first light-absorbing layer 41 and the second light-absorbing layer 42 may include, for example, an organic material that includes a light absorber, etc. The light absorber includes, for example, a pigment. The pigment may include, for example, carbon black. The pigment may include, for example, a metal oxide (e.g., light-absorbing titanium oxide, etc.). The light absorber may include an organic pigment. The organic materials described above may include, for example, at least one selected from the group consisting of PET (polyethylene terephthalate), PEN (polyethylene naphthalate), polyimide, and PC (polycarbonate). The organic materials described above may include, for example, at least one selected from the group consisting of PVT (polyvinyl toluene), PVK (polyvinylcarbazole), and PMMA (polymethyl methacrylate). For example, the organic material that is included in the light-absorbing layer described above may include the same material as the organic material included in the scintillator layer 11.

Second Embodiment

Figure 8A:
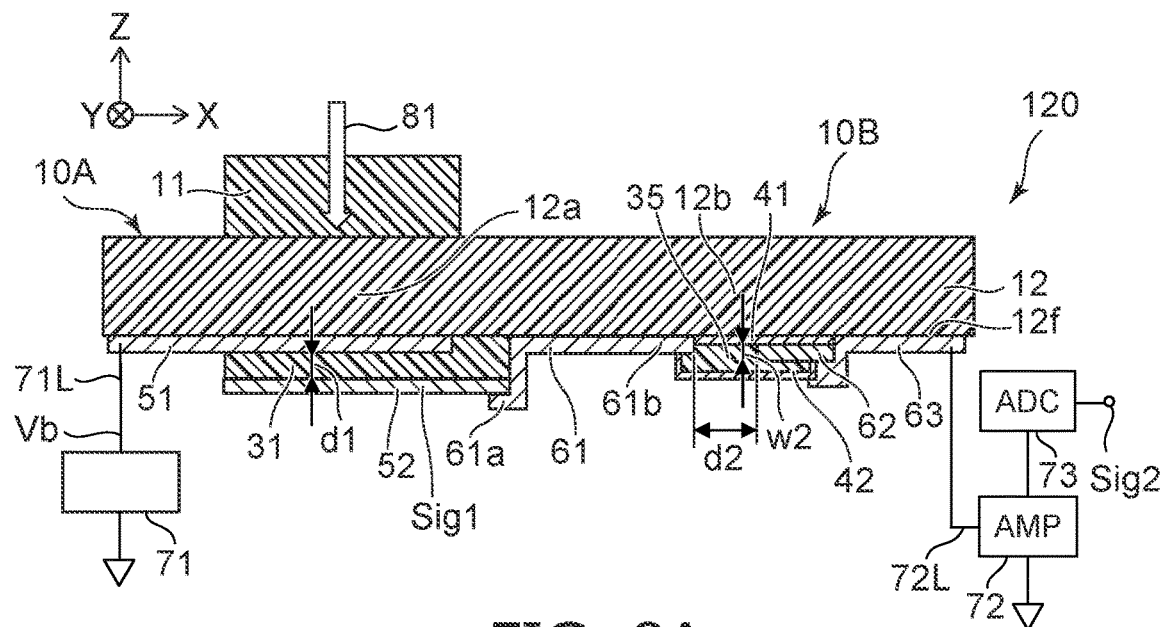
FIGS. 8A and 8B are schematic views illustrating a radiation detector according to a second embodiment.
Figure 8B:
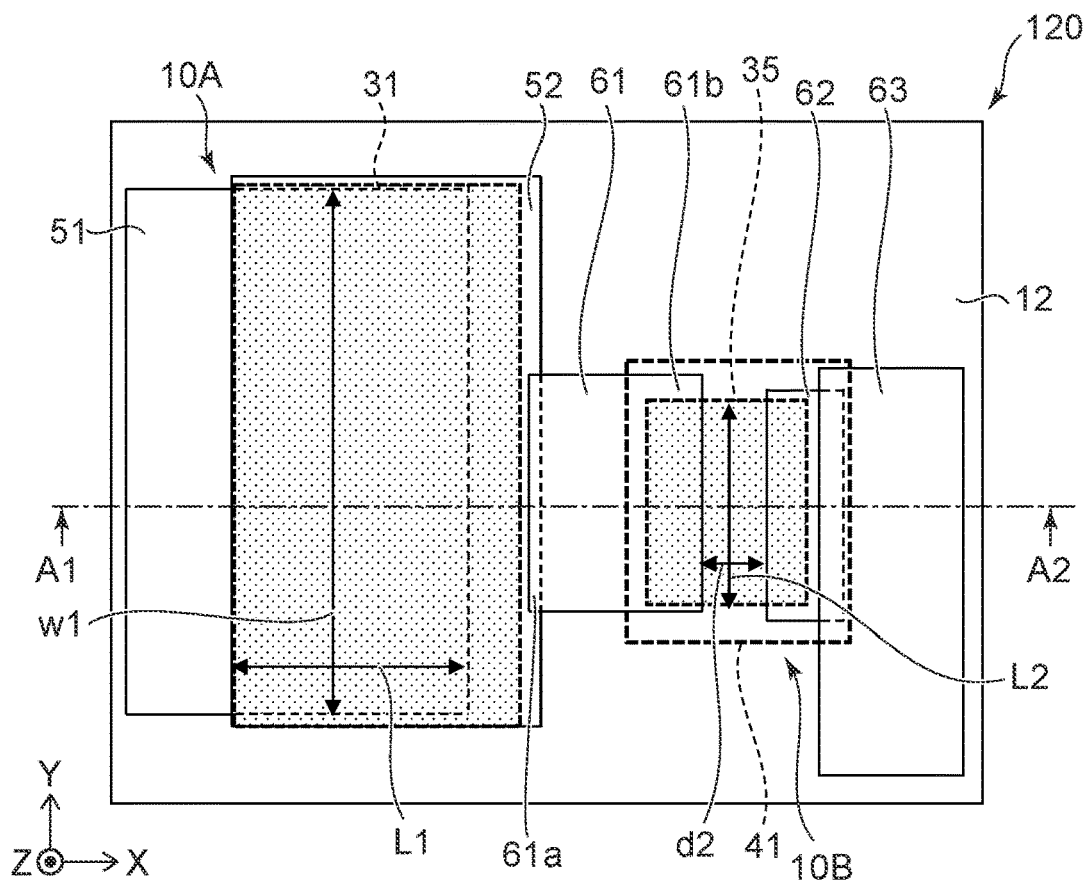

FIGS. 8A and 8B are schematic views illustrating a radiation detector according to a second embodiment.

FIG. 8A is a line A1-A2 cross-sectional view of FIG. 8B. FIG. 8B is a plan view in which a portion included in the radiation detector is extracted.

As shown in FIG. 8A, the radiation detector 120 according to the embodiment includes the detecting part 10A and the transmitting part 10B. The detecting part 10A is configured to output the signal Sig1 corresponding to the radiation 81 that is incident on the detecting part 10A. The transmitting part 10B includes the first conductive layer 61, the second conductive layer 62, and the organic layer 35. The first conductive layer 61 is electrically connected with the detecting part 10A.

In the radiation detector 120, the detecting part 10A includes the first electrode 51, a second electrode 52, and the semiconductor layer 31. The semiconductor layer 31 is between the second electrode 52 and the first electrode 51 in the first direction (the Z-axis direction). The second electrode 52 is electrically connected with the first conductive layer 61. For example, the first conductive portion 61*a* of the first conductive layer 61 is electrically connected with the second electrode 52.

At least a portion of the organic layer 35 is between the first conductive layer 61 and the second conductive layer 62 in the second direction crossing the first direction (the Z-axis direction).

Thus, the second electrode 52 may be provided separately from the first conductive portion 61*a* of the first conductive layer 61. In such a radiation detector 120 as well, the signal output is obtained with a high intensity even when the surface area of the detecting part 10A is increased. For example, a faint signal can be detected by combining with the amplifier 72. For example, the generation of noise can be suppressed by combining with the amplifier 72. A radiation detector can be provided in which the sensitivity can be increased.

In the radiation detector 120 as well, it is favorable for the electrical capacitance of the transmitting part 10B to be less than the electrical capacitance of the detecting part 10A. For example, the detecting part 10A includes the first surface area S1 of the region where the second electrode 52 and the first electrode 51 face each other in the first direction (the Z-axis direction), and the first distance d1 in the first direction between the second electrode 52 and the first electrode 51 (referring to FIG. 8A). The transmitting part 10B includes at least one of the second surface area S2 or the second distance d2. The second surface area S2 is the surface area of the region where the first conductive layer 61 and the second conductive layer 62 face each other in the second direction. The second surface area S2 is less than the first surface area S1. The second distance d2 is the distance in the second direction between the first conductive layer 61 and the second conductive layer 62 (referring to FIG. 8A). The second distance d2 is greater than the first distance d1. For example, S2/d2 is less than S1/d1. For example, S2 is less than S1. For example, d2 is greater than d1.

The first surface area S1 corresponds to the product of the first length L1 and the first width w1 of the region where the second electrode 52 and the first electrode face each other in the first direction. The second surface area S2 is the product of the second length L2 and the second width w2 of the region where the first conductive layer 61 (which may be the second conductive portion 61$b$) and the second conductive layer 62 face each other in the second direction (e.g., the Z-axis direction).

In the radiation detector 120 as well, it is favorable for the material of the second conductive layer 62 to be different from the material of the first conductive layer 61. For example, the electrical resistance of the transmitting part 10B may be asymmetric with respect to the polarity. For example, the electrical resistance between the first conductive layer 61 and the second conductive layer 62 when the current flows from the second conductive layer 62 toward the first conductive layer 61 is less than the electrical resistance between the first conductive layer 61 and the second conductive layer 62 when the current flows from the first conductive layer 61 toward the second conductive layer 62. For example, the charge that is stored in the transmitting part 10B can be quickly discharged. For example, a high response speed is easily obtained.

In the radiation detectors 110 to 115 and 120, the organic layer 35 may include the same material as the material included in the semiconductor layer 31. Moderate insulative properties are obtained in the organic layer 35. The stored electric charge can be discharged at a moderate rate.

In the radiation detectors 110 to 115 and 120, a portion of the organic layer 35 may overlap the first and second conductive layers 61 and 62 in a direction (e.g., the first direction, i.e., the Z-axis direction) that crosses the direction from the first conductive layer 61 toward the second conductive layer 62. The characteristics of the transmitting part 10B are easily stabilized thereby.

According to the embodiment, the semiconductor layer 31 includes, for example, a p-type region and an n-type region. The p-type region includes, for example, at least one of polythiophene or a polythiophene derivative. The n-type region may include, for example, at least one selected from the group consisting of fullerene and a fullerene derivative.

In one example, the semiconductor layer 31 includes, for example, poly(3-hexylthiophene) and [6,6]-phenyl-$C_{61}$-butyric acid methyl ester. The p-type region may include, for example, subphthalocyanine or a subphthalocyanine derivative. The p-type region may include, for example, polythiophene or a polythiophene derivative.

The scintillator layer 11 includes, for example, at least one selected from the group consisting of PVT (polyvinyl toluene), PVK (polyvinylcarbazole), and PMMA (polymethyl methacrylate).

The base body 12 includes, for example, a resin. The resin includes, for example, at least one selected from the group consisting of PET (polyethylene terephthalate), PEN (polyethylene naphthalate), polyimide, and PC (polycarbonate).

According to the embodiment, the sensitivity of the radiation detector may be high for β-rays and low for other radiation. For example, the sensitivity of a first signal generated in the detecting part 10A when beta rays are incident on the detecting part 10A is greater than the sensitivity of a second signal generated in the detecting part 10A when at least one of gamma rays, neutron rays, or X-rays are incident on the detecting part 10A. High selectivity for the detection of β-rays is obtained by combining the semiconductor layer 31 and the organic scintillator layer 11.

Embodiments may include the following configurations (e.g., technological proposals).

Configuration 1

A radiation detector, comprising:
a detecting part configured to output a signal, the signal corresponding to radiation incident on the detecting part; and
a transmitting part,
the transmitting part including
a first conductive layer electrically connected with the detecting part, the first conductive layer being configured to transmit the signal,
a second conductive layer separated from the first conductive layer, and
an organic layer,
at least a portion of the organic layer being between the first conductive layer and the second conductive layer.

Configuration 2

The radiation detector according to Configuration 1, wherein
the detecting part includes a first electrode and a semiconductor layer,
the first conductive layer includes a first conductive portion and a second conductive portion,
the semiconductor layer is between the first conductive portion and the first electrode in a first direction, and
the at least a portion of the organic layer is between the second conductive portion and the second conductive layer in a second direction crossing the first direction.

Configuration 3

The radiation detector according to Configuration 2, wherein
the detecting part includes:
a first surface area of a region where the first conductive portion and the first electrode face each other in the first direction; and
a first distance in the first direction between the first conductive portion and the first electrode,
the transmitting part includes at least one of a second surface area or a second distance, the second surface area is a surface area of a region where the second conductive portion and the second conductive layer face each other in the second direction,
the second surface area is less than the first surface area,
the second distance is a distance in the second direction between the second conductive portion and the second conductive layer, and
the second distance is greater than the first distance.

Configuration 4

The radiation detector according to Configuration 2 or 3, wherein
a material of the second conductive layer is different from a material of the second conductive portion.

Configuration 5

The radiation detector according to Configuration 1, wherein
the detecting part includes a first electrode, a second electrode, and a semiconductor layer,
the semiconductor layer is between the second electrode and the first electrode in a first direction,
the second electrode is electrically connected with the first conductive layer, and
the at least a portion of the organic layer is between the first conductive layer and the second conductive layer in a second direction crossing the first direction.

Configuration 6

The radiation detector according to Configuration 5, wherein
the detecting part includes:
a first surface area of a region where the second and first electrodes face each other in the first direction; and
a first distance in the first direction between the second electrode and the first electrode,
the transmitting part includes at least one of a second surface area or a second distance,
the second surface area is a surface area of a region where the first and second conductive layers face each other in the second direction,
the second surface area is less than the first surface area,
the second distance is a distance in the second direction between the first conductive layer and the second conductive layer, and
the second distance is greater than the first distance.

Configuration 7

The radiation detector according to Configuration 5 or 6, wherein
a material of the second conductive layer is different from a material of the first conductive layer.

Configuration 8

The radiation detector according to any one of Configurations 2 to 7, further comprising:
a base body including a first base body region and a second base body region,
at least a portion of the first electrode being between the semiconductor layer and the first base body region in the first direction,
a direction from the at least a portion of the organic layer toward the second base body region being along the first direction.

Configuration 9

The radiation detector according to Configuration 8, wherein
the detecting part further includes a scintillator layer,
the first electrode is between the semiconductor layer and the scintillator layer, and
the first base body region is between the first electrode and the scintillator layer.

Configuration 10

The radiation detector according to Configuration 8 or 9, further comprising:
a first light-absorbing layer,
the first light-absorbing layer being between the organic layer and the base body,
an absorptance of the first light-absorbing layer for light being greater than an absorptance of the organic layer for the light.

Configuration 11

The radiation detector according to Configuration 10, further comprising:
a second light-absorbing layer,
the organic layer being between the second light-absorbing layer and the first light-absorbing layer,
an absorptance of the second light-absorbing layer for light being greater than the absorptance of the organic layer for the light.

Configuration 12

The radiation detector according to any one of Configurations 2 to 7, further comprising:
a first light-absorbing layer and a second light-absorbing layer,
the organic layer being between the second light-absorbing layer and the first light-absorbing layer,
an absorptance of the first light-absorbing layer for light and an absorptance of the second light-absorbing layer for the light being greater than an absorptance of the organic layer for the light.

Configuration 13

The radiation detector according to any one of Configurations 10 to 12, wherein
the first light-absorbing layer is insulative.

Configuration 14

The radiation detector according to any one of Configurations 2 to 7, wherein
the detecting part further includes a scintillator layer, and
the first electrode is between the semiconductor layer and the scintillator layer.

Configuration 15

The radiation detector according to any one of Configurations 2 to 14, wherein
the organic layer includes a same material as a material included in the semiconductor layer.

Configuration 16

The radiation detector according to any one of Configurations 2 to 15, wherein
the second conductive layer includes a same material as a material included in the first electrode.

Configuration 17

The radiation detector according to any one of Configurations 2 to 16, wherein
the first electrode includes In, Sn, and oxygen.

Configuration 18

The radiation detector according to any one of Configurations 2 to 17, wherein
the first conductive layer includes at least one selected from the group consisting of Al, Mg, B, and C.

Configuration 19

The radiation detector according to any one of Configurations 1 to 18, wherein
an electrical resistance between the first conductive layer and the second conductive layer when a current flows from the second conductive layer toward the first conductive layer is less than an electrical resistance between the first conductive layer and the second conductive layer when a current flows from the first conductive layer toward the second conductive layer.

Configuration 20

The radiation detector according to any one of Configurations 1 to 19, wherein a portion of the organic layer overlaps the first and second conductive layers in a direction crossing a direction from the first conductive layer toward the second conductive layer.

According to embodiments, a radiation detector can be provided in which the sensitivity can be increased.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as detecting parts, transmitting parts, conductive layers, organic layers, scintillator layers, electrodes, semiconductor layers, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a detecting part configured to output a signal, the signal corresponding to radiation incident on the detecting part; and
a transmitting part, the transmitting part including a first conductive layer electrically connected with the detecting part, the first conductive layer being configured to transmit the signal,
a second conductive layer separated from the first conductive layer, and an organic layer,
at least a portion of the organic layer being between the first conductive layer and the second conductive layer,
wherein the detecting part includes a first electrode and a semiconductor layer,
the first conductive layer includes a first conductive portion and a second conductive portion,
the semiconductor layer is between the first conductive portion and the first electrode in a first direction, and
the at least a portion of the organic layer is between the second conductive portion and the second conductive layer in a second direction crossing the first direction.

2. The detector according to claim 1, wherein the detecting part includes: a first surface area of a region where the first conductive portion and the first electrode face each other in the first direction; and a first distance in the first direction between the first conductive portion and the first electrode, the transmitting part includes at least one of a second surface area or a second distance, the second surface area is a surface area of a region where the second conductive portion and the second conductive layer face each other in the second direction, the second surface area is less than the first surface area, the second distance is a distance in the second direction between the second conductive portion and the second conductive layer, and the second distance is greater than the first distance.

3. The detector according to claim 1, wherein a material of the second conductive layer is different from a material of the second conductive portion.

4. The detector according to claim 1, wherein
the detecting part includes a first electrode, a second electrode, and a semiconductor layer,
the semiconductor layer is between the second electrode and the first electrode in a first direction,
the second electrode is electrically connected with the first conductive layer, and
the at least a portion of the organic layer is between the first conductive layer and the second conductive layer in a second direction crossing the first direction.

5. The detector according to claim 4, wherein
the detecting part includes:
a first surface area of a region where the second and first electrodes face each other in the first direction; and
a first distance in the first direction between the second electrode and the first electrode,
the transmitting part includes at least one of a second surface area or a second distance,
the second surface area is a surface area of a region where the first and second conductive layers face each other in the second direction,
the second surface area is less than the first surface area,
the second distance is a distance in the second direction between the first conductive layer and the second conductive layer, and
the second distance is greater than the first distance.

6. The detector according to claim 4, wherein
a material of the second conductive layer is different from a material of the first conductive layer.

7. The detector according to claim 1, further comprising:
a base body including a first base body region and a second base body region, at least a portion of the first electrode being between the semiconductor layer and the first base body region in the first direction, a direction from the at least a portion of the organic layer toward the second base body region being along the first direction.

8. The detector according to claim 7, wherein
the detecting part further includes a scintillator layer,
the first electrode is between the semiconductor layer and the scintillator layer, and
the first base body region is between the first electrode and the scintillator layer.

9. The detector according to claim 7, further comprising:
a first light-absorbing layer,
the first light-absorbing layer being between the organic layer and the base body,
an absorptance of the first light-absorbing layer for light being greater than an absorptance of the organic layer for the light.

10. The detector according to claim 9, further comprising:
a second light-absorbing layer,
the organic layer being between the second light-absorbing layer and the first light-absorbing layer,
an absorptance of the second light-absorbing layer for light being greater than the absorptance of the organic layer for the light.

11. The detector according to claim 1, further comprising:
a first light-absorbing layer and a second light-absorbing layer, the organic layer being between the second light-absorbing layer and the first light-absorbing layer, an absorptance of the first light-absorbing layer for light and an absorptance of the second light-absorbing layer for the light being greater than an absorptance of the organic layer for the light.

12. The detector according to claim 9, wherein
the first light-absorbing layer is insulative.

13. The detector according to claim 1, wherein the detecting part further includes a scintillator layer, and the first electrode is between the semiconductor layer and the scintillator layer.

14. The detector according to claim 1, wherein the organic layer includes a same material as a material included in the semiconductor layer.

15. The detector according to claim 1, wherein the second conductive layer includes a same material as a material included in the first electrode.

16. The detector according to claim 1, wherein the first electrode includes In, Sn, and oxygen.

17. The detector according to claim 1, wherein the first conductive layer includes at least one selected from the group consisting of Al, Mg, B, and C.

18. The detector according to claim 1, wherein
an electrical resistance between the first conductive layer and the second conductive layer when a current flows from the second conductive layer toward the first conductive layer is less than an electrical resistance between the first conductive layer and the second conductive layer when a current flows from the first conductive layer toward the second conductive layer.

19. The detector according to claim 1, wherein
a portion of the organic layer overlaps the first and second conductive layers in a direction crossing a direction from the first conductive layer toward the second conductive layer.

* * * * *